United States Patent
Chen et al.

(10) Patent No.: US 9,662,812 B2
(45) Date of Patent: May 30, 2017

(54) METHODS FOR MOLDING INTEGRATED CIRCUITS

(75) Inventors: Chih-Hao Chen, Hsin-Chu (TW); Hsien-Wen Liu, Hsin-Chu (TW); Yi-Lin Tsai, Tainan (TW); Jui-Pin Hung, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 567 days.

(21) Appl. No.: 13/485,307

(22) Filed: May 31, 2012

(65) Prior Publication Data
US 2013/0207306 A1  Aug. 15, 2013

Related U.S. Application Data

(60) Provisional application No. 61/598,567, filed on Feb. 14, 2012.

(51) Int. Cl.
| | |
|---|---|
| *B29C 43/18* | (2006.01) |
| *H01L 21/56* | (2006.01) |
| *H01L 23/31* | (2006.01) |
| *H01L 23/00* | (2006.01) |

(52) U.S. Cl.
CPC ............ *B29C 43/18* (2013.01); *H01L 21/565* (2013.01); *H01L 23/3121* (2013.01); *H01L 24/16* (2013.01); *H01L 24/32* (2013.01); *H01L 24/73* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/94* (2013.01); *H01L 2924/157* (2013.01); *H01L 2924/1531* (2013.01)

(58) Field of Classification Search
CPC .... B29C 2045/7343; B29C 2045/7356; B29C 2045/7312; B29C 43/00; B29C 45/16
USPC ........ 264/271.1, 272.11, 272.13, 327, 272.17
See application file for complete search history.

(56) References Cited

U.S. PATENT DOCUMENTS

| | | | | |
|---|---|---|---|---|
| 4,534,003 A | * | 8/1985 | Manzione | ...................... 700/200 |
| 5,110,515 A | * | 5/1992 | Nakamura et al. | ........... 264/493 |
| 5,338,497 A | * | 8/1994 | Murray et al. | ................ 264/486 |
| 5,348,460 A | * | 9/1994 | Baader | .............. B29C 45/14024 |
| | | | | 264/272.11 |
| 5,419,864 A | * | 5/1995 | Sheer et al. | .................. 264/254 |
| 5,556,647 A | * | 9/1996 | Abe et al. | ...................... 425/127 |
| 5,766,649 A | * | 6/1998 | Azuma | ............. B29C 45/14655 |
| | | | | 249/135 |
| 5,928,598 A | * | 7/1999 | Anderson et al. | ............ 264/446 |
| 6,157,086 A | * | 12/2000 | Weber | ................... H01L 21/563 |
| | | | | 257/788 |
| 6,546,620 B1 | * | 4/2003 | Juskey | ..................... H01L 24/81 |
| | | | | 228/180.21 |

(Continued)

FOREIGN PATENT DOCUMENTS

| | | | | |
|---|---|---|---|---|
| CN | | 101079383 | 11/2007 | |
| CN | | 101625983 | 1/2010 | |
| WO | WO2010/146860 | A1 * | 12/2010 | ............. H01G 4/224 |

*Primary Examiner* — Nahida Sultana
(74) *Attorney, Agent, or Firm* — Slater Matsil, LLP

(57) ABSTRACT

A method includes molding a polymer onto a package component. The step of molding includes a first molding stage performed at a first temperature, and a second molding stage performed at a second temperature different from the first temperature.

20 Claims, 9 Drawing Sheets

(56) References Cited

U.S. PATENT DOCUMENTS

| | | | |
|---|---|---|---|
| 7,355,278 B2* | 4/2008 | Shibata | H01L 21/565 |
| | | | 264/272.11 |
| 7,943,078 B2* | 5/2011 | Sekido et al. | 264/328.8 |
| 8,092,735 B2* | 1/2012 | Thompson et al. | 264/272.17 |
| 8,268,226 B2* | 9/2012 | Vander Wel et al. | 264/486 |
| 8,303,878 B2* | 11/2012 | Thompson et al. | 264/272.17 |
| 8,987,918 B2* | 3/2015 | Razdan et al. | 257/774 |
| 9,030,000 B2* | 5/2015 | Eu | H01L 23/3128 |
| | | | 257/692 |
| 2007/0275507 A1 | 11/2007 | Muraki | |
| 2008/0044511 A1* | 2/2008 | Chang | B29C 45/73 |
| | | | 425/547 |
| 2011/0127694 A1* | 6/2011 | Kurita et al. | 264/272.13 |
| 2012/0063128 A1* | 3/2012 | Nall | F21V 29/004 |
| | | | 362/230 |
| 2013/0183862 A1* | 7/2013 | Ni | H01R 12/71 |
| | | | 439/620.22 |
| 2015/0146399 A1* | 5/2015 | Viswanathan | H01L 24/83 |
| | | | 361/785 |

* cited by examiner

METHODS FOR MOLDING INTEGRATED CIRCUITS

This application claims the benefit of the following provisionally filed U.S. patent application: Application Ser. No. 61/598,567, filed Feb. 14, 2012, and entitled "Method for Molding Process;" which application is hereby incorporated herein by reference.

BACKGROUND

Molding is a commonly used technique to protect integrated circuit devices from the damage of external environments. In a typical molding process, a molding compound is dispensed on a device that is to be molded. A mold is used to confine and shape the molding compound. The molding compound is then cured and solidified, followed by the removal of the mold from the molding compound.

When large integrated circuit components (such as wafers) are molded, air bubbles may be trapped in the molding compound. This is often caused by the high viscosity of the molding compound, which fails to flow to all of the regions that are to be molded. Stresses may be generated in the molded packages due to the existence of air bubbles when atmospheric pressure changes. For example, after a device is molded, some process steps may need to be performed in vacuum environments. These process steps include, for example, Chemical Vapor Deposition (CVD), Physical Vapor Deposition (PVD), and the like. The air bubbles causes stresses in the molded packages due to the pressure differences inside and outside the air bubbles. The stresses may cause thin wafers to break. In addition, the air bubbles may also result in a high degree of warpage in the molded packages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A multi-temperature molding process is provided in accordance with various exemplary embodiments. The intermediate stages of the molding process are illustrated. The variations of the embodiments are discussed. Throughout the various views and illustrative embodiments, like reference numbers are used to designate like elements.

Figure 1:
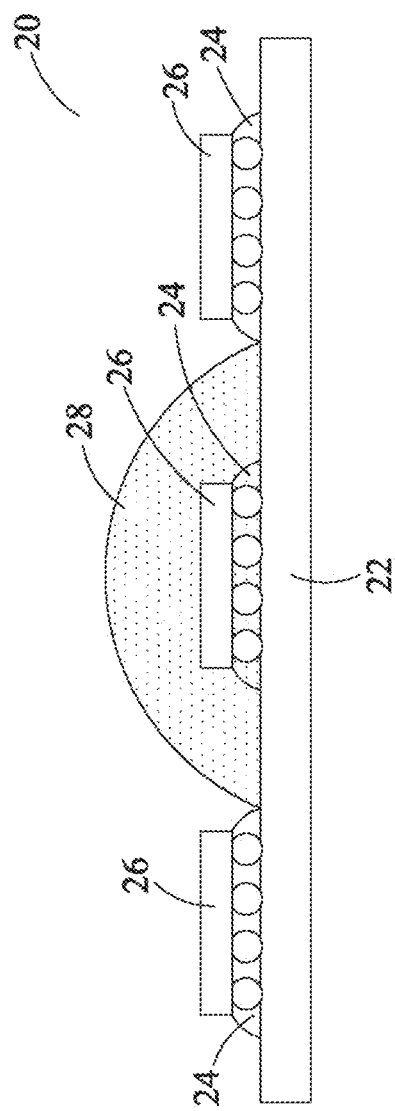
FIGS. 1 through 3 are cross-sectional views of intermediate stages in the molding of a package in accordance with some exemplary embodiments.
Figure 2:
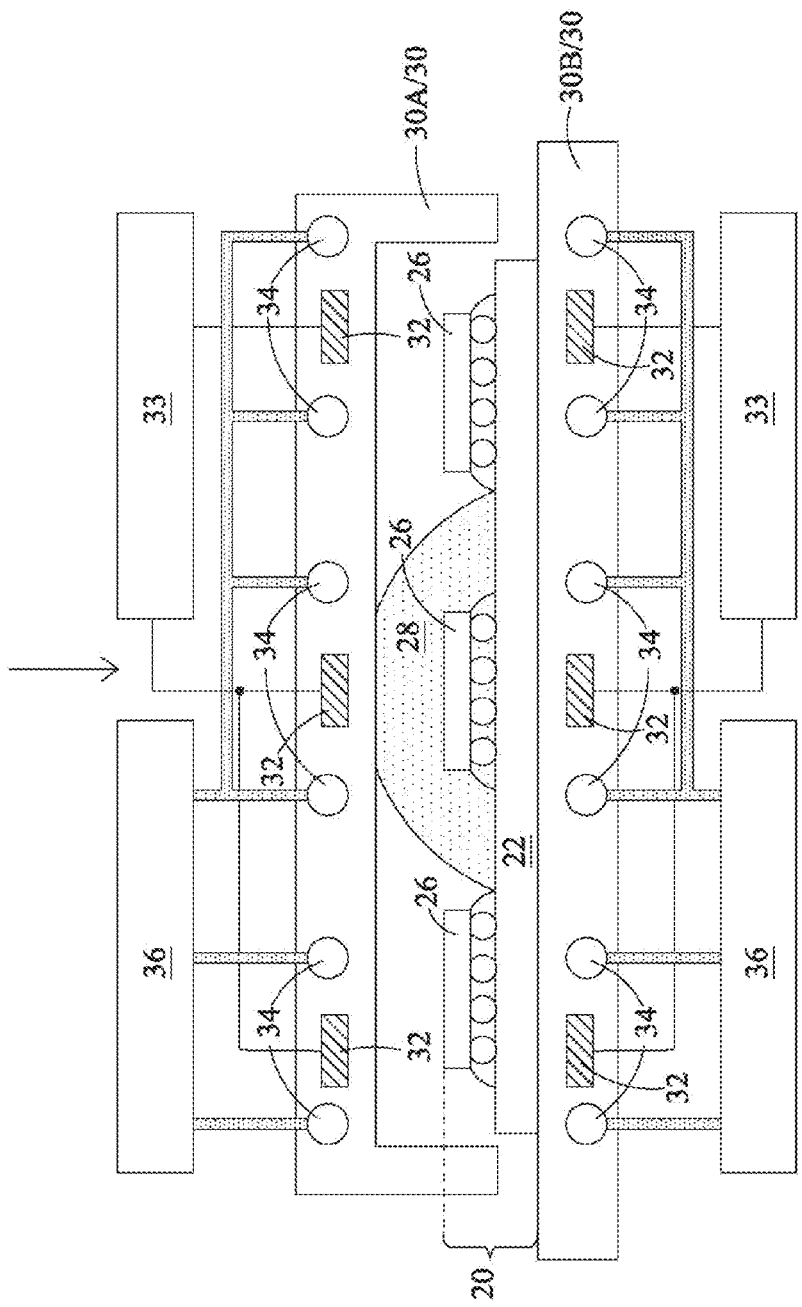
Figure 3:
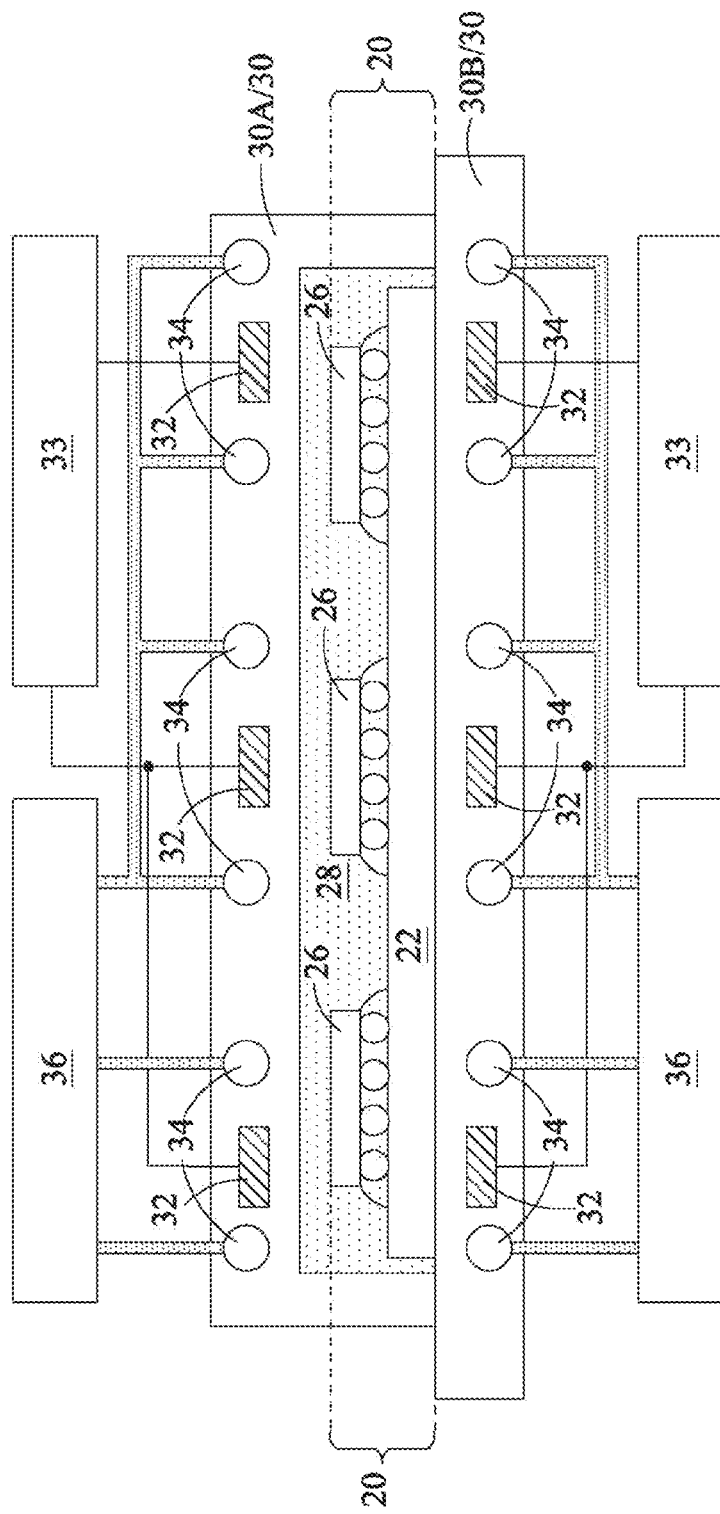

FIGS. 1 through 3 illustrate cross-sectional views of intermediate stages in the molding of package component 20 in accordance with some exemplary embodiments. Package component 20 includes package components 26 bonded to package component 22. In some embodiments, package component 22 is a device wafer, which may be a semiconductor wafer with integrated circuits formed therein. In alternative embodiments, package component 22 is an interposer wafer, which does not include active devices such as transistors therein. Package component 22, when being an interposer wafer, may or may not include passive devices therein. In these embodiments, the interposer wafer may include through-vias (not shown) electrically interconnecting the conductive features on opposite sides of the package component 22. In yet alternative embodiments, package component 22 is a package substrate (such as a laminate substrate).

Package components 26 may be device dies, packages, or the like. Underfill 24 may be filled in the gaps between package components 26 and package component 22. Polymer 28 is dispensed over package components 22 and/or 26. In some embodiments, polymer 28 is dispensed over a center portion of package component 20. Polymer 28 may be a molding compound, a molding underfill, a resin, or the like. At this time, polymer 28 is not cured.

Referring to FIG. 2, mold 30 is used to mold polymer 28 on package component 20. In some embodiments, mold 30 includes upper mold 30A and lower mold 30B. In alternative embodiments, the molding may be performed using upper mold 30A, and not using lower mold 30B. In the illustrated embodiments, package component 20 is placed on lower mold 30B. Polymer 28 is dispensed on package component 20. Upper mold 30A is then pressed down against polymer 28. As a result, polymer 28 is squeezed aside, as shown in FIG. 3, and is spread over the entire package component 20. Mold 30 is also used to hold polymer 28 and shape polymer 28 during the molding process. Polymer 28 fills the gaps between package components 26, and may further include a portion over package components 26.

It is appreciated that mold 30 may have various shapes, and there are various of ways of dispensing polymer 28. For example, in some embodiments, package component 20 is placed on lower mold 30B first. Upper mold 30A is then placed on mold 30B. Upper mold 30A and lower mold 30B define a space, with package component 22 placed in the space. Polymer 28 is then dispensed into the space defined by upper mold 30A and lower mold 30B.

Referring back to FIG. 2, mold 30 includes heating elements 32 therein. Heating elements 32 are configured to heat mold 30 to desirable temperatures. Heating elements 32 are further connected to power supply unit 33, which is configured to adjust and supply suitable currents, so that heating elements 32 may heat mold 30 to the desirable temperatures. Heating elements 32 may include, for example, coils. Furthermore, heating elements 32 may be embedded in either one or both of upper mold 30A and lower mold 30B.

As also shown in FIGS. 2 and 3, cooling elements 34 may also be formed in mold 30. Cooling elements 34 are configured to cool mold 30 to desirable temperatures. Cooling elements 34 are further connected to chiller 36, which is configured to provide a coolant to cooling elements 34. Cooling elements 34 may include, for example, coiled pipes, which are connected to chiller 36, and receive the coolant from chiller 36. In some embodiments, chiller 36 includes a compressor, or includes a storage for storing the coolant. The coolant may be oil, water, compressible gases, or the like. Furthermore, cooling elements 34 may be embedded in, or attached to, either one or both of upper mold 30A and lower mold 30B.

Figure 4:
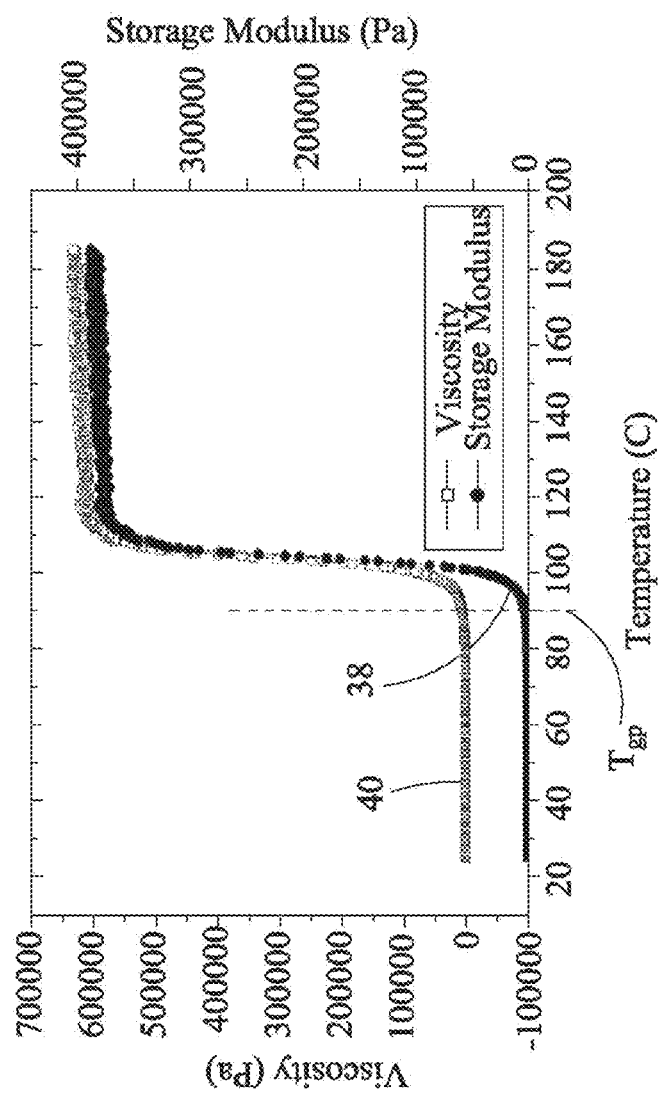
FIG. 4 illustrates the viscosity and the storage modulus of a molding compound as functions of temperature.

FIG. 4 illustrates the viscosity and the storage modulus of exemplary polymer 28 that is shown in FIGS. 2 and 3, wherein the viscosity and the storage modulus are shown as functions of temperature. The left Y-axis marks the viscosity, and corresponds to the points marked as 38. The right Y-axis marks the storage modulus, and corresponds to the points marked as 40. Polymer 28 has gel temperature Tgp (also known as a gel point), which is the temperature above which the viscosity of polymer 28 significantly increases with the increase in temperature. Below gel temperature Tgp, however, the viscosity stays substantially uniform, for example, in the temperature range between the room temperature (about 21° C.) and the gel temperature.

As also shown in FIG. 4, the storage modulus (the right Y-axis) of polymer 28 may be low when the temperature of polymer 28 is equal to or below gel temperature Tgp. Above gel temperature Tgp, the storage modulus of polymer 28 increases significantly with the increase in temperature, which means that polymer 28 starts to solidify when the temperature of polymer 28 is higher than gel temperature Tgp. Accordingly, below gel temperature Tgp, the shape of polymer 28 can be changed easily, for example, when pressed by upper mold 30A (FIG. 2). In addition, since the viscosity of polymer 28 is low when the temperature of polymer 28 is below or at the gel temperature Tgp, it is easy for polymer 28 to flow when polymer 28 is at or below gel temperature Tgp. Conversely, above gel temperature Tgp, it is more and more difficult for polymer 28 to flow when the temperature of polymer 28 increases.

Figure 5:
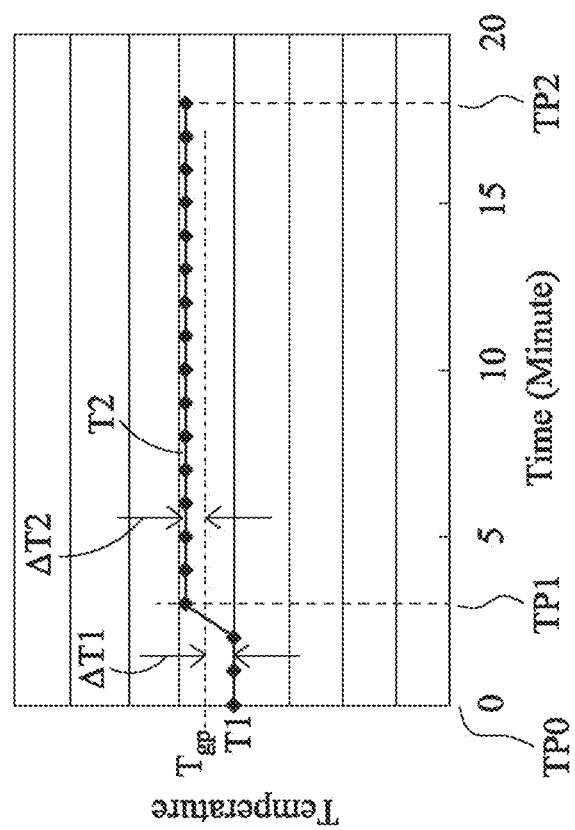
FIGS. 5 through 9 illustrate various exemplary temperature profiles of molding processes in accordance with embodiments.

FIG. 5 illustrates an exemplary temperature profile of mold 30 and polymer 28, wherein the temperature profile corresponds to the molding stages during which polymer 28 (FIGS. 2 and 3) is molded onto package component 20. The temperature of mold 30 and polymer 28 is illustrated as a function of time. It is appreciated that the temperature of polymer 28 may be slightly different from the temperature of mold 30. The difference, however, is not significant enough to cause the characteristic change in polymer 28. Furthermore, with some soaking time, the difference between the temperature of polymer 28 and mold 30 may be further reduced. Accordingly, throughout the description, the temperature of polymer 28 is assumed to be the same as the temperature of mold 30.

In accordance with some embodiments, at time point TP0, the temperatures of mold 30 and polymer 28 are at T1, which is lower than gel temperature Tgp. Time point TP0 may be the time point that mold 30 (for example, upper mold 30A) is put into contact with polymer 28, as shown in FIG. 2. At this time point, however, polymer 28 has not been spread fully over the entire package component 22 yet. The shape of the polymer 28 is also not the final shape that polymer 28 is solidified to.

During the period of time starting from upper mold 30A is in contact with polymer 28 and ending at the time polymer 28 is just fully spread, the temperature T1 of mold 30 may remain below gel temperature Tgp. The temperature of mold 30 may be maintained at temperature T1 for an additional period of time after polymer 28 is fully spread. In some exemplary embodiments, temperature T1 is between about 25° C. and about 100° C. As shown in FIG. 5, temperature difference ΔT1, which is (Tgp−T1), may be greater than about 0.5° C., or greater than about 1° C. Temperature T1 may also remain substantial uniform for longer than about 30 seconds, for example. At time point TP1, which is after polymer 28 is fully spread, the temperature of mold 30 is increased to temperature T2, which is higher than gel temperature Tgp. In some exemplary embodiments, temperature T2 is between about 100° C. and about 250° C.

The maintenance of mold 30 at temperatures T1 and T2, and the increase in the temperature of mold 30 are achieved by controlling power supply unit 33 (FIGS. 2 and 3) to conduct appropriate currents to heating elements 32. Accordingly, the current for heating mold 30/polymer 28 to the second temperature T2 is higher than the current for heating mold 30/polymer 28 to the first temperature T1. At the same time mold 30 is heated, chiller 36 (FIGS. 2 and 3) turns off the flow of the coolant to cooling element 34.

In some embodiments, time point TP1 occurs after upper mold 30A is in contact with package component 22 or lower mold 30B, as shown in FIG. 3. Time point TP1 is also after polymer 28 is fully spread. During the entire period of time polymer 28 is being shaped by mold 30, the temperature of mold 30 may remain below gel temperature Tgp in some embodiments. Accordingly, polymer 28 is also at a temperature below gel temperature Tgp, and hence it is easy for polymer 28 to flow, and the chance of trapping air bubbles inside polymer 28 is reduced.

Temperature T2, which is higher than gel temperature Tgp, is high enough for polymer 28 to be cured. In accordance with some embodiments, temperature difference ΔT2, which is (T2−Tgp), is greater than about 0.5° C., and may be greater than about 1° C. Furthermore, temperature difference ΔT3, which is (T2−T1), may be greater than about 3° C., and may be greater than about 5° C., for example. After a period of time, and at time point TP2, the curing of polymer 28 is finished, and polymer 28 is solidified. Mold 30 (FIG. 3) may then be removed from package component 20 and polymer 28. At the time mold 30 is removed from package polymer 28, mold 30 may still be at temperature T2 in some embodiments.

FIGS. 6 through 9 illustrate temperature profiles of polymer 28 and/or mold 30 in accordance with alternative embodiments. Unless specified otherwise, the temperatures in these embodiments may be similar to the temperatures that are denoted by like reference numerals in the embodiments shown in FIG. 5.

Figure 6:
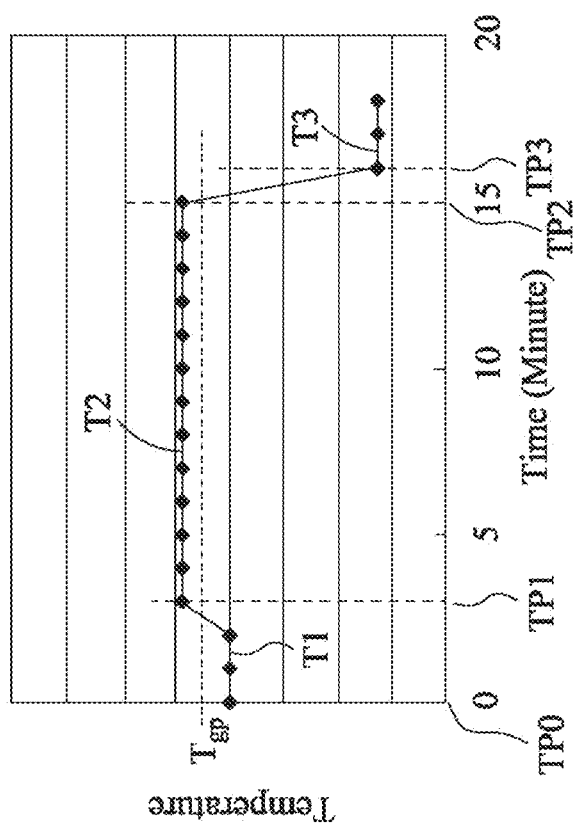

FIG. 6 illustrates the exemplary temperature profile of mold 30 (or polymer 28) in accordance with alternative embodiments. This molding process is similar to the molding process shown in FIG. 5, except that after the curing is finished at time point TP2, a cooling process is conducted to cool mold 30, polymer 28, and package component 20 (FIG. 3). During the cooling process, mold 30 is cooled, for example, by conducting a coolant from chiller 36 into cooling elements 34. At the same time, the electrical current for heating mold 30 is turned off. The cooling of mold 30 and/or polymer 28 may be performed at a rate between about 10° C./second and about 1° C./second, for example, although different cooling rates may be used. Temperature T3, at which temperature mold 30 is removed from polymer 28, may be between about 20° C. and about 50° C. Since at the time the cooling is conducted, mold 30 is rigid, and confines polymer 28 and package component 20, mold 30 help absorb the stress generated in polymer 28 and package component 20, which stress is partially due to the difference in the Coefficients of Thermal Expansion (CTE) between polymer 28 and package component 20.

Figure 7:
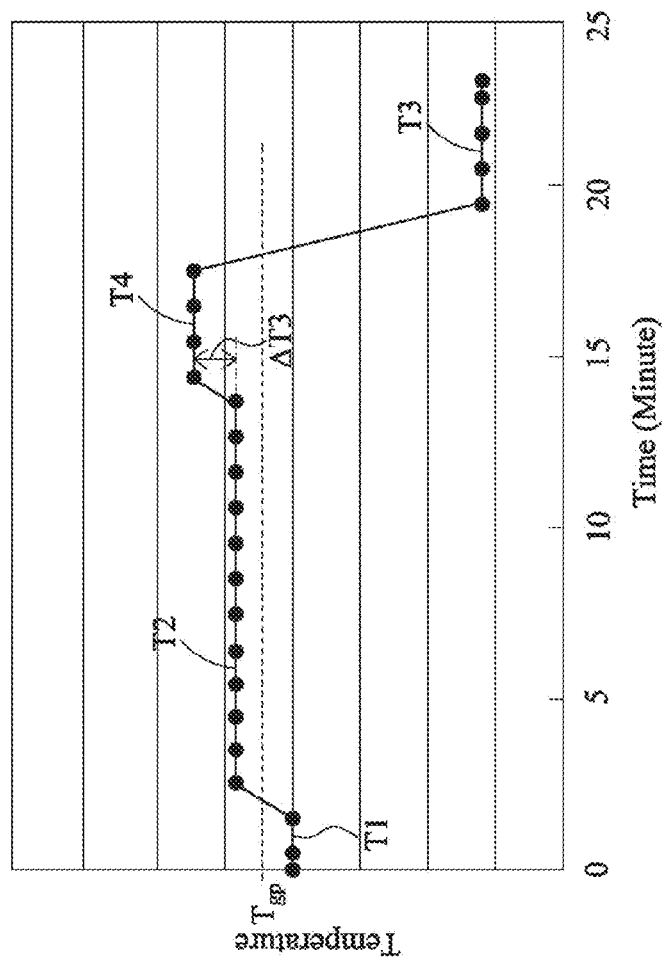
Figure 8:
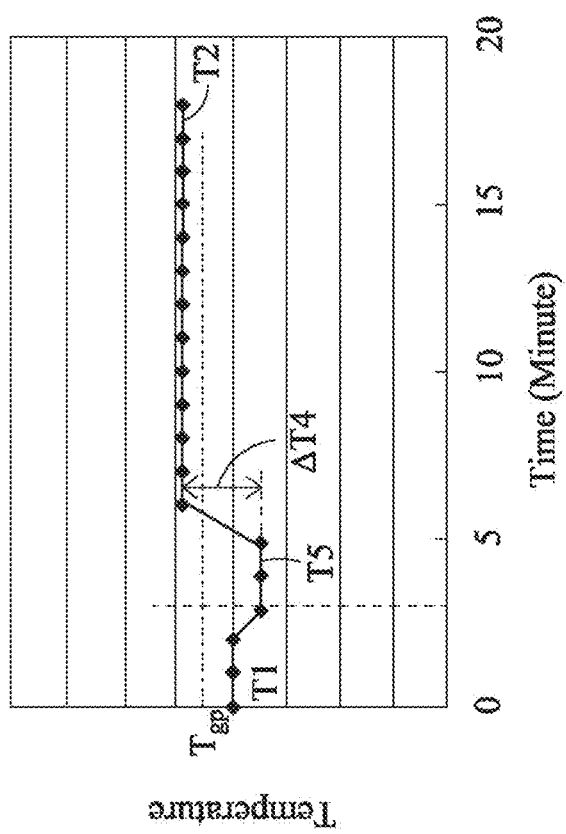
Figure 9:
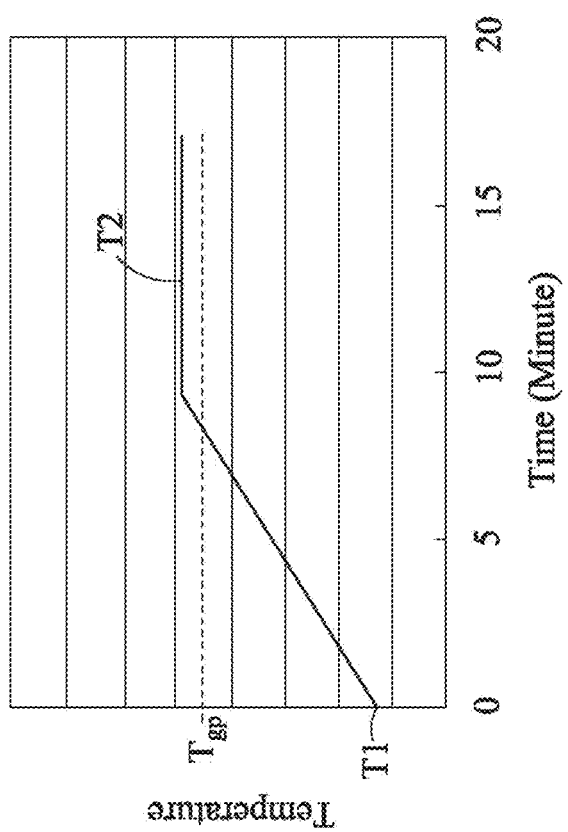

FIGS. 7, 8, and 9 illustrate temperature profiles of mold 30 and/or polymer 28 in accordance with alternative molding processes. In FIG. 7, a further temperature stage T4 is added, wherein temperature T4 is higher than temperature T2. Accordingly, at temperature stage T2, polymer 28 may be partially cured, while at temperature T4, polymer 28 is fully cured. Temperature difference ΔT3, which is (T4−T2), may be greater than about 1° C., and may further be greater than about 5° C.

In FIG. 8, a further temperature stage T5 is added, and temperature T5 is lower than temperature T1, and lower than gel temperature Tgp. Temperature stage T5 may be allocated before or after the occurrence of temperature stag T1. Temperature difference ΔT4, which is (T1−T2, may be greater than about 1° C., and may further be greater than about 5° C.

In FIG. 9, temperature T1 (the time mold 30 starts to be in contact with polymer 28) is a low temperature, for example, close to the room temperature. Temperature T1 in these embodiments may also be between about 20° C. and about 50° C. Between temperatures T1 and T2, the temperatures of mold 30 and/or polymer 28 continuously and gradually increase. The increase in the temperatures from temperature T1 to T2 may thus take longer time, so that enough time (during which polymer 28 is at temperatures lower than gel temperature Tgp) is allowed for polymer 28 to spread.

Throughout the embodiments in FIGS. 5 through 9, temperatures T1 through T5 may be maintained substantially uniformly for a period of time to allow polymer 28 (FIG. 2) to flow, and to allow the curing to finish. In some embodiments, the substantially uniform temperature may be maintained for a period of time, for example, between about 30 seconds and about 120 seconds.

It is appreciated that the multi-temperature molding may be used on various molding methods, including, and not limited to, compressive molding, transfer molding, and the like. Furthermore, the multi-temperature molding may be used on the package components including die-to-wafer bonding, die-to-die bonding, and the like.

In accordance with embodiments, a method includes molding a polymer onto a package component. The step of molding includes a first molding stage performed at a first temperature, and a second molding stage performed at a second temperature different from the first temperature.

In accordance with other embodiments, a method includes molding a polymer onto a package component, wherein the polymer has a gel temperature. The step of molding includes performing a first molding step at a first temperature lower than the gel temperature. After the first molding step, a second molding step is performed at a second temperature higher than the gel temperature.

In accordance with yet other embodiments, a method includes molding a molding compound onto a package component using a mold, wherein the mold includes a heating element for heating the mold. The step of molding includes dispensing the molding compound onto the package component, and supplying a first current to the heating element to maintain the mold at a first temperature. When the mold is at the first temperature, pressing the mold against the molding compound to spread the molding compound over the package component. After the step of pressing, a second current higher than the first current is supplied to the heat element to increase the temperature of the mold to a second temperature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   molding a polymer onto a package component, wherein the step of molding comprises:
   dispensing the polymer onto the package component, wherein the polymer is flowable at a time of dispensing, and is in physical contact with the package component when dispensed;
   pressing the polymer using a mold to spread the polymer dispensed on the package component, wherein the mold comprises a top portion and a sidewall portion underlying and joined to the top portion as an integral part, wherein edges of the sidewall portion block the polymer from flowing horizontally, wherein during a period of time starting from a first time point the mold is in contact with the polymer and ending at a second time point the polymer is fully spread, the mold is maintained at, or below, a first temperature lower than a gel temperature of the polymer, wherein when pressing the polymer using the mold, a first current is conducted to a heating element in the mold;
   after the polymer is fully spread, heating the mold to raise a temperature of the polymer to a second temperature higher than the gel temperature, wherein during the heating the mold to raise the temperature of the polymer to the second temperature, a second current higher than the first current is conducted to the heating element; and
   removing the mold from the polymer, wherein the polymer is left to mold the package component.

2. The method of claim 1 further comprising, after the heating the mold to raise the temperature of the polymer to the second temperature, and without removing the mold from the polymer, cooling the polymer.

3. The method of claim 2, wherein the step of cooling the polymer is performed by conducting a coolant into a pipe built in the mold.

4. The method of claim 1, wherein the second temperature is higher than the first temperature by a temperature difference greater than about 2° C.

5. A method comprising:
   molding a polymer onto a first package component, wherein the polymer has a gel temperature, and wherein the step of molding comprises:
   dispensing the polymer onto the first package component, wherein the first package component comprises a device die bonded to a second package component, and the polymer is dispensed to be in contact with both the device die and the second package component;

pressing the polymer using an upper mold to spread the polymer, wherein the upper mold comprises a top portion and a sidewall portion underlying and integrated with the top portion to form an integral part, and wherein during the pressing, the sidewall portion and the top portion are lowered simultaneously during the pressing;

performing a first molding step at a first temperature lower than the gel temperature, wherein during the first molding step, the polymer is flowable, wherein the first molding step starts from a first time point the upper mold is in contact with the polymer and ends at a time not earlier than a second time point the polymer is fully spread; and after the first molding step, performing a second molding step at a second temperature higher than the gel temperature to solidify the polymer, wherein the second molding step starts after the polymer is fully spread; and after the second molding step, and without removing the upper mold from the polymer, cooling the polymer by conducting a coolant into a pipe built in the upper mold.

6. The method of claim 5, wherein the second temperature is higher than the first temperature by a temperature difference greater than about 2° C.

7. The method of claim 5, wherein during the first molding step, a first current is conducted to a heating element in an upper mold, wherein the upper mold is used to hold and heat the polymer, and wherein during the second molding step, a second current higher than the first current is conducted to the heating element.

8. The method of claim 5 further comprising removing the upper mold from the polymer at the second temperature.

9. A method comprising:
molding a molding compound onto a package component using a mold comprising a top portion and a sidewall portion underlying and integrated with the top portion to form an integral part, wherein the mold comprises a heating element for heating the mold, and wherein the step of molding comprises:
dispensing the molding compound onto the package component, wherein the molding compound is flowable, and is in physical contact with the package component when dispensed;
supplying a first current to the heating element to maintain the mold at a first temperature when the molding compound is flowable, wherein the first temperature is lower than a gel temperature of the molding compound;
when the mold is at the first temperature, pressing the mold against the molding compound to spread the molding compound over the package component, with both the top portion and the sidewall portion lowered during the pressing, wherein edges of the sidewall portions define an edge shape of the molding compound;
after the step of pressing, supplying a second current higher than the first current to the heating element to increase the temperature of the mold to a second temperature; and
removing the mold from the molding compound, wherein the molding compound is left to mold the package component.

10. The method of claim 9, wherein the molding compound has a gel temperature, and wherein the second temperature is higher than the gel temperature.

11. The method of claim 9 further comprising adjusting the temperature of the mold to a third temperature different from the first and the second temperatures.

12. The method of claim 11, wherein the third temperature is lower than the first and the second temperatures, and wherein the step of adjusting the temperature of the mold to the third temperature comprises supplying a coolant to the mold to cool the mold.

13. The method of claim 12, wherein the step of adjusting the temperature of the mold to the third temperature is performed after the molding compound is fully cured.

14. The method of claim 11, wherein the third temperature is higher than the first and the second temperatures.

15. The method of claim 1 further comprising during the period of time, heating the mold to maintain the polymer to be at the first temperature, and wherein during the period of time, the polymer is flowable.

16. The method of claim 5 further comprising, during the first molding step and the second molding step, heating at least one of the upper mold and a lower mold to heat the polymer to the first temperature.

17. The method of claim 1, wherein during the pressing, the sidewall portion and the top portion are lowered simultaneously during the pressing.

18. The method of claim 1, wherein the package component comprises a device die, and after the polymer is dispensed, the polymer fully embeds the device die.

19. The method of claim 5, wherein after the polymer is dispensed, the polymer fully embeds the device die.

20. The method of claim 9, wherein the package component comprises a device die, and after the molding compound is dispensed, the molding compound fully embeds the device die.

* * * * *